(12) United States Patent
Satomi

(10) Patent No.: US 9,143,103 B2
(45) Date of Patent: Sep. 22, 2015

(54) POWER AMPLIFYING DEVICE AND TRANSMITTER

(71) Applicant: Kabushiki Kaisha Toshiba, Minato-ku (JP)

(72) Inventor: Akihiro Satomi, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 33 days.

(21) Appl. No.: 14/090,008

(22) Filed: Nov. 26, 2013

(65) Prior Publication Data

US 2014/0253247 A1 Sep. 11, 2014

(30) Foreign Application Priority Data

Mar. 7, 2013 (JP) .................................. 2013-045633

(51) Int. Cl.
*H04B 1/04* (2006.01)
*H03F 3/68* (2006.01)
*H03F 3/21* (2006.01)
*H03F 3/24* (2006.01)
*H03F 3/60* (2006.01)

(52) U.S. Cl.
CPC .................. *H03F 3/68* (2013.01); *H03F 3/211* (2013.01); *H03F 3/24* (2013.01); *H03F 3/602* (2013.01); *H03F 2200/207* (2013.01); *H03F 2203/21142* (2013.01); *H03F 2203/21157* (2013.01)

(58) Field of Classification Search
USPC ............. 455/103, 127.1, 127.2, 127.3, 114.2; 330/295, 124 R; 342/58
See application file for complete search history.

(56) References Cited

U.S. PATENT DOCUMENTS

| | | | |
|---|---|---|---|
| 4,011,512 A | | 3/1977 | Drury |
| 4,064,464 A | * | 12/1977 | Morse .............................. 330/53 |
| 4,422,047 A | | 12/1983 | Wright |
| 5,561,397 A | * | 10/1996 | Kumar et al. .................. 330/295 |

(Continued)

FOREIGN PATENT DOCUMENTS

| | | |
|---|---|---|
| JP | 01-053615 | 3/1989 |
| JP | 11-274874 | 10/1999 |

(Continued)

OTHER PUBLICATIONS

U.S. Appl. No. 13/868,244, filed Apr. 23, 2013, Akihiro Satomi.

(Continued)

*Primary Examiner* — Nguyen Vo
(74) *Attorney, Agent, or Firm* — Oblon, McClelland, Maier & Neustadt, L.L.P.

(57) ABSTRACT

Certain embodiments provide a power amplifying device including: a distribution line which distributes power; a plurality of power amplifying elements; a connection line; an output line; a filter; a first directional coupler; and a second directional coupler. The power amplifying elements is provided at a stage subsequent to the distribution line. The connection line is provided at a stage subsequent to each of the power amplifying elements and combines outputs of the power amplifying elements. The output line is connected to the connection line. The filter is placed on the connection line or the output line. The first and second directional couplers are provided at a stage subsequent to the filter. The first directional coupler outputs the high frequency signal transmitted to the output line, to a RF monitor terminal. The second directional coupler outputs the high frequency signal transmitted to the output line, to a level detection detector.

19 Claims, 4 Drawing Sheets

(56) References Cited

U.S. PATENT DOCUMENTS

| | | |
|---|---|---|
| 6,252,461 B1 | 6/2001 | Raab |
| 6,552,634 B1 | 4/2003 | Raab |
| 6,819,171 B2 * | 11/2004 | Kenington ............... 330/51 |
| 2002/0094791 A1 * | 7/2002 | Pehlke et al. ............ 455/115 |
| 2006/0205375 A1 | 9/2006 | Vaisanen |
| 2009/0270056 A1 * | 10/2009 | Singerl et al. ........... 455/127.1 |
| 2011/0199156 A1 | 8/2011 | Hayakawa |

FOREIGN PATENT DOCUMENTS

| | | |
|---|---|---|
| JP | 2000-059152 | 2/2000 |
| JP | 2002-111414 | 4/2002 |
| JP | 2006-108741 | 4/2006 |
| JP | 2007-006046 | 1/2007 |
| JP | 2007-158812 | 6/2007 |
| JP | 2008-028509 | 2/2008 |

OTHER PUBLICATIONS

Extended European Search Report issued Jan. 8, 2014 in Patent Application No. 13193919.1.

* cited by examiner

POWER AMPLIFYING DEVICE AND TRANSMITTER

CROSS REFERENCE TO RELATED APPLICATIONS

This application is based upon and claims the benefit of priority from the prior Japanese Patent Application No. 2013-045633 filed in Japan on Mar. 7, 2013; the entire contents of which are incorporated herein by reference.

FIELD

Embodiments described herein relate generally to a power amplifying device and a transmitter.

BACKGROUND

A high power output is required in a transmitter such as a radar transmitter which uses solid-state elements. In the transmitter, a plurality of power amplifying devices is used. The transmitter outputs the high power by combining outputs of these power amplifiers. The radar power amplifying device is generally highly efficient. The radar power amplifying device outputs the high power by operating the solid-state elements in a non-linear region. However, when a power amplifying device is operated in a non-linear region, the output includes a fundamental wave component and, in addition, a spurious and a harmonic component. Hence, a transmitter has a filter which filters the harmonic component to suppress that the harmonic component is emitted from an antenna.

Further, the power amplifying device has a level detection detector which monitors the output (transmission power). Furthermore, the power amplifying device has an RF monitor terminal which monitors a transmission output level and an occurrence situation of a harmonic.

A conventional transmitter has one filter element at a stage subsequent of a combiner which combines outputs of a plurality of power amplifying devices. Hence, high power handling capability is required in the filter element. However, the filter element having high power handling capability is large and expensive. Hence, there is a problem that the transmitter becomes large and expensive.

When a small filter element is provided in each of the power amplifying devices, the filter element having high power handling capability does not need to be provided, and a cheap filter element can be used as the small filter. Generally, a filter element is formed by covering by a package a filter body such as a filter pattern and coaxial cables each of which connects the filter body and a connector which is an external connection terminal. When such a filter element is provided in each of the power amplifying devices, mounting space of the filter element increases, and therefore the dimension of the power amplifying device increases. Therefore, even when the small filter element is provided in each of the power amplifying devices, it is difficult to at least miniaturize the transmitter.

Further, a conventional power amplifying device has directional couplers on a line through which a high frequency signal is transmitted, and supplies one of outputs of the directional couplers to a level detection detector and a RF monitor terminal through the distributor. Hence, a harmonic produced by the level detection detector is also outputted to the RF monitor terminal. Therefore, there is a problem that it is not possible to accurately monitor a spurious of the power amplifying device.

DETAILED DESCRIPTION

Figure 1:
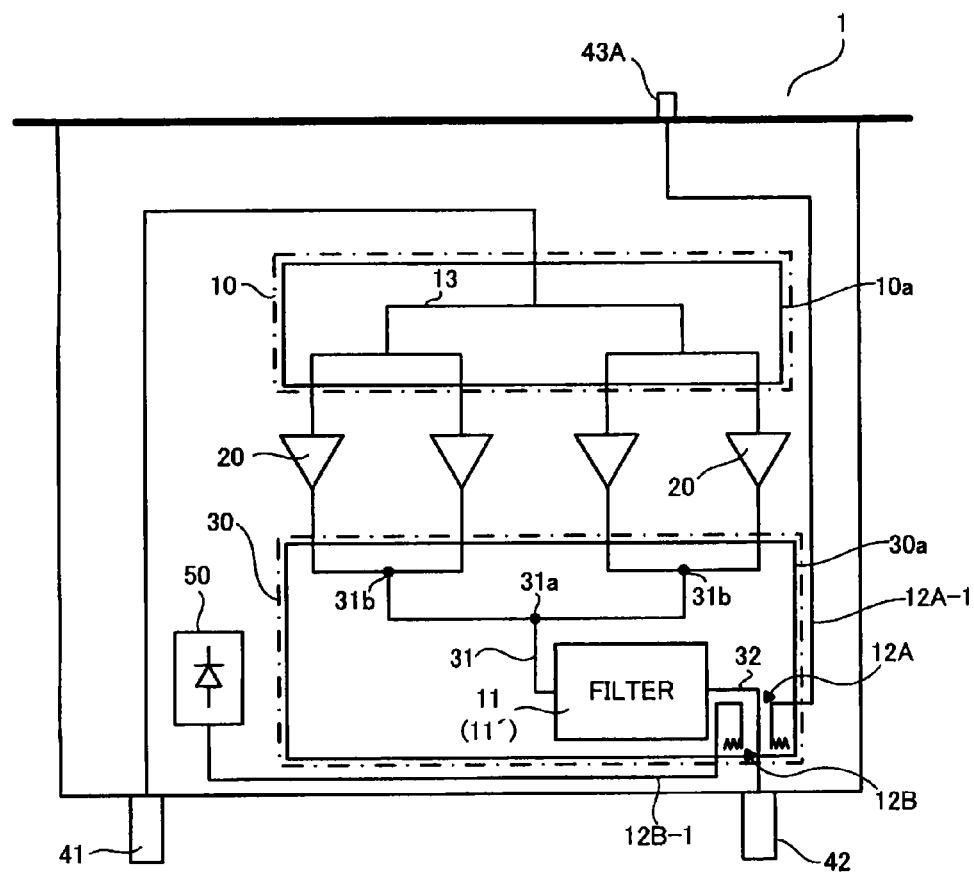
FIG. 1 is a view illustrating a power amplifying device according to a first embodiment.

Certain embodiments provide a power amplifying device including: a distribution line which distributes power; a plurality of power amplifying elements; a connection line; an output line; a filter; a first directional coupler; and a second directional coupler. A plurality of power amplifying elements is provided at a stage subsequent to the distribution line and amplifies the power distributed from the distribution line. The connection line is provided at a stage subsequent to each of the power amplifying elements and combines outputs of the power amplifying elements. The output line is connected to the connection line. The filter is placed on the connection line or the output line, and filters a predetermined frequency included in a high frequency signal transmitted to the connection line or the output line. The first directional coupler is provided at a stage subsequent to the filter, and outputs the high frequency signal transmitted to the output line, to a RF monitor terminal. The second directional coupler is provided at a stage subsequent to the filter, and outputs the high frequency signal transmitted to the output line, to a level detection detector.

Certain embodiments provide a transmitter including: a distributor which distributes power; a plurality of power amplifying devices; and a combiner. Each of the power amplifying devices has: a distribution line; a plurality of power amplifying elements; a connection line; an output line; a filter; a first directional coupler; and a second directional coupler. The distribution line distributes power distributed from the distributor. A plurality of power amplifying elements is provided at a stage subsequent to the distribution line and amplifies the power distributed from the distribution line. The connection line is provided at a stage subsequent to each of the power amplifying elements and combines outputs of the power amplifying elements. The output line is connected to the connection line. The filter is placed on the connection line or the output line, and filters a predetermined frequency included in a high frequency signal transmitted to the connection line or the output line. The first directional coupler is provided at a stage subsequent to the filter, and outputs the high frequency signal transmitted to the output line, to a RF monitor terminal. The second directional coupler is provided at a stage subsequent to the filter, and outputs the high frequency signal transmitted to the output line, to a level detection detector.

Hereinafter, a power amplifying device and a transmitter according to the embodiment will be described in detail using the drawings.

Certain embodiments provide a power amplifying device basically including: a distribution line which distributes power; a plurality of power amplifying elements which is provided at a stage subsequent to the distribution line and amplifies the power; a connection line which is provided at a stage subsequent to each of the power amplifying elements and combines outputs of the power amplifying elements; a filter which is placed on the connection line or the output line connected to this connection line, and which filters a predetermined frequency; first and second directional couplers which are provided on the output line at a stage subsequent to the filter.

(First Embodiment)

FIG. 1 is a view illustrating a power amplifying device 1 according to a first embodiment. As illustrated in FIG. 1, the power amplifying device 1 schematically has a power distributing unit 10 which has a distribution line 13, a plurality of power amplifying elements 20 and a power combination unit 30 which has a connection line 31. Further, the power combination unit 30 of the power amplifying device 1 has a level detection detector 50 which monitors a high frequency signal obtained by combining outputs from a plurality of power amplifying elements 20, and two directional couplers 12A and 12B.

The power distributing unit 10 is connected to an input terminal 41, and has the distribution line 13 which distributes power given from the input terminal 41. The distribution line 13 is, for example, a micro stripline of an airline structure, and is provided on a substrate 10a. The distribution line 13 is a line which is formed by repeating that one line is branched to two lines.

The power amplifying device 1 has a plurality of power amplifying elements 20 which amplifies power, at a stage subsequent to the distribution line 13.

Further, the power amplifying device 1 has the power combination unit 30 at a stage subsequent to each power amplifying element 20. The power combination unit 30 has the connection line 31 which combines power outputted from the power amplifying elements 20. The connection line 31 is, for example, a micro stripline of an airline structure, and is provided on a substrate 30a. The connection line 31 has a plurality of stages of connection portions 31a and 31b which connect the two lines as one line and combines power by collecting the power to one line finally.

The power amplifying device 1 has a filter 11 which filters a predetermined frequency, at a stage subsequent to the connection line 31 on the substrate 30a on the power combination unit 30. The filter 11 is, for example, a lowpass filter or a bandpass filter.

Figure 2:
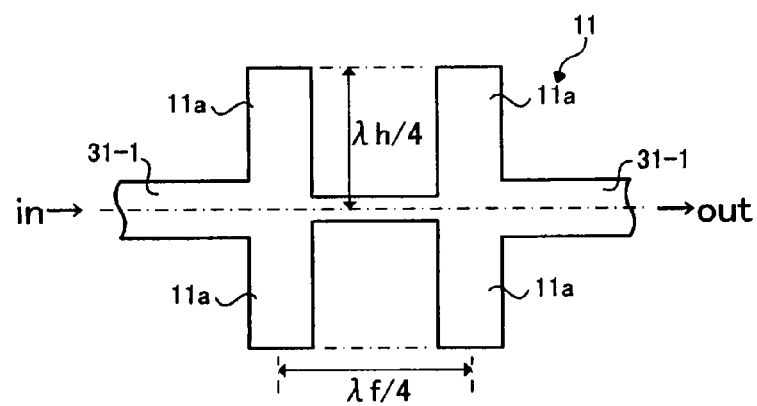
FIG. 2 is a view illustrating an example of a filter used in the power amplifying device illustrated in FIG. 1.

FIG. 2 is a view illustrating an example of the filter 11 used in the power amplifying device illustrated in FIG. 1. As illustrated in FIG. 2, the filter 11 is, for example, a filter which is formed by connecting a plurality of open stubs 11a each of which has a length of λh/4 of a harmonic to be filtered and each of which has an open end to extended portions 31-1 of the connection line 31 which is the micro stripline at an interval of λf/4 of a fundamental wave of the high frequency signal.

Figure 3:
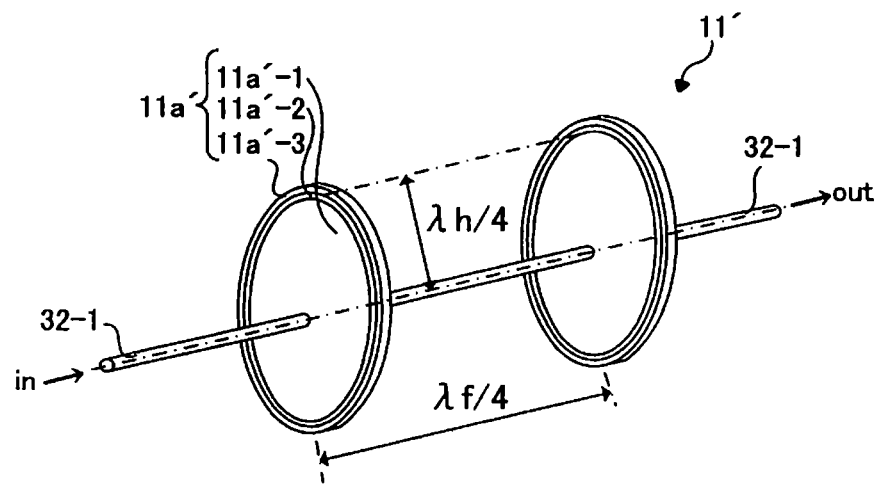
FIG. 3 is a view illustrating another example of a filter used in the power amplifying device illustrated in FIG. 1.

Further, the filter 11 may be a tubular filter 11'. FIG. 3 is a view illustrating another example of the filter 11 used in the power amplifying device illustrated in FIG. 1, and is a view illustrating the tubular filter 11'. As illustrated in FIG. 3, the tubular filter 11' is a filter which is formed by connecting a plurality of disk portions 11a' to the extended portion 32-1 of the inner conductor of the output line 32 formed with an RF coaxial cable as described below at an interval of λf/4 of the fundamental wave of the high frequency signal. In the tubular filter 11', each of disk portions 11a' is provided by forming a teflon (registered trademark) 11a'-2 which is an insulator and an outer conductor 11a'-3 around a disk-shaped inner conductor 11a'-1 which has a radius of λh/4 of a harmonic to be filtered in this order.

As this filter 11 (11'), a filter which can be provided on the substrate 30a on which the connection line 31 is formed in a stage subsequent to the power amplifying elements 20 of the power combination unit 30 and which corresponds to a filter body of a conventional filter element is used. Further, as the filter 11 (11'), a filter which is provided in a package in which the connection line 31 is accommodated and which is small and cheap is used.

An output from the filter 11 is given to the output terminal 42 through the output line 32 which is formed with, for example, an RF coaxial cable. When the filter 11 illustrated in FIG. 2 is applied as the filter 11, the output of the filter 11 is connected to the output line 32. Further, when the tubular filter 11' illustrated in FIG. 3 is applied as the filter 11, the input of the filter 11' is connected to the connection line 31.

Further, on the substrate 30a of the power combination unit 30 and between the filter 11 (11') and the output terminal 42, the first and second directional couplers 12A and 12B are provided. One output of the first directional coupler 12A is connected to an RF monitor output terminal 43A, and one output of the second directional coupler 12B is connected to the level detection detector 50. Further, the other output of the first directional coupler 12A and the other output of the second directional coupler 12B are common, and this common output is connected to the output terminal 42.

The first directional coupler 12A is a traveling wave detection directional coupler which is formed by placing part of the output line 32 and part of a first line 12A-1 which extends toward a traveling direction of a high frequency signal transmitted from one end portion connected to the RF monitor output terminal 43 to the output line 32 and whose other end portion is terminated, close to each other.

The second directional coupler 12B is a traveling wave detection directional coupler which is formed by placing part of the output line 32 and part of a second line 12B-1 which extends toward a traveling direction of a high frequency signal transmitted from one end portion connected to the level detection detector 50 to the output line 32 and whose other end portion is terminated, close to each other.

Further, the harmonic detected by the first directional coupler 12A is outputted through the RF monitor output terminal 43A, and is supplied to monitor the harmonic (spurious) of the power amplifying device 1. Furthermore, the harmonic detected by the second directional coupler 12B is given to the level detection detector 50, and is used to detect an output (transmission power) of the power amplifying device 1.

Figure 4:
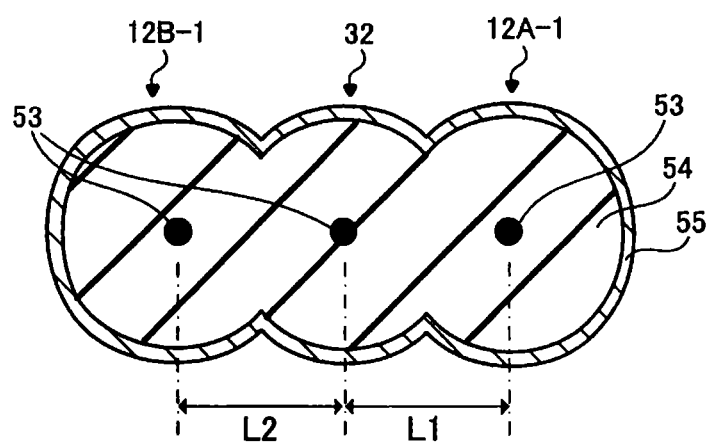
FIG. 4 is a cross-sectional view of first and second directional couplers used in the power amplifying device illustrated in FIG. 1.

The power amplifying device 1 employing this configuration can substantially reduce leakage of the harmonic produced by the level detection detector 50 to the RF monitor output terminal 43A by adjusting the degrees of coupling of the first and second directional couplers 12A and 12B to a degree of coupling of a directional coupler which is normally used or less (for example, about 20 dB to 60 dB). As illustrated in FIG. 4, when the output line 32, the first line 12A-1 and the second line 12B-1 which form the first and second directional couplers 12A and 12B are RF coaxial cables which are each formed with the inner conductor 53, the insulator 54 such as teflon (registered trademark) which surrounds the periphery of the inner conductor 53 and the outer conductor 55 which is formed on an outer periphery surface of this insulator 54, the degree of coupling of the first directional coupler 12A can be adjusted by adjusting an interval L1 between the inner conductor 53 of the output line 32 and the inner conductor 53 of the first line 12A-1, and the degree of coupling of the second directional coupler 12B can be adjusted by adjusting an interval L2 between the inner conductor 53 of the output line 32 and the inner conductor 53 of the first line 12B-1. The degrees of coupling are lower when L1 and L2 are longer.

Hence, the power amplifying device according to the embodiment can accurately monitor the spurious of the harmonic produced by the power amplifying device 1 without being influenced by the harmonic produced by the level detection detector 50.

Further, in the power amplifying device according to the embodiment, the filter 11 (11') corresponding to the filter body of the conventional filter element is placed on the connection line 31 or the output line 32 without using the filter element whose filter body is mounted in the package. Consequently, it is possible to save space corresponding to the package of the filter element and miniaturize the power amplifying device 1.

Further, conventionally, to simultaneously monitor an output and a harmonic of the power amplifying device, it is necessary to provide a switch in the power amplifying device and to switch a monitor output using the switch. By contrast with this, the power amplifying device according to the embodiment does not need to switch outputs of the traveling wave detection directional couplers to one of the level detection detector 50 and the RF monitor output terminal side 43A using the switch, and, consequently, can simultaneously monitor the output and the harmonic of the power amplifier 1. Consequently, it is possible to miniaturize the power amplifying device 1 which can simultaneously monitor the output and the harmonic of the power amplifying device. Further, a control signal for switching the switch is unnecessary, so that it is also possible to reduce manufacturing cost of the power amplifier 1 which can simultaneously monitor the output and the harmonic of the power amplifying device.

(Second Embodiment)

Figure 5:
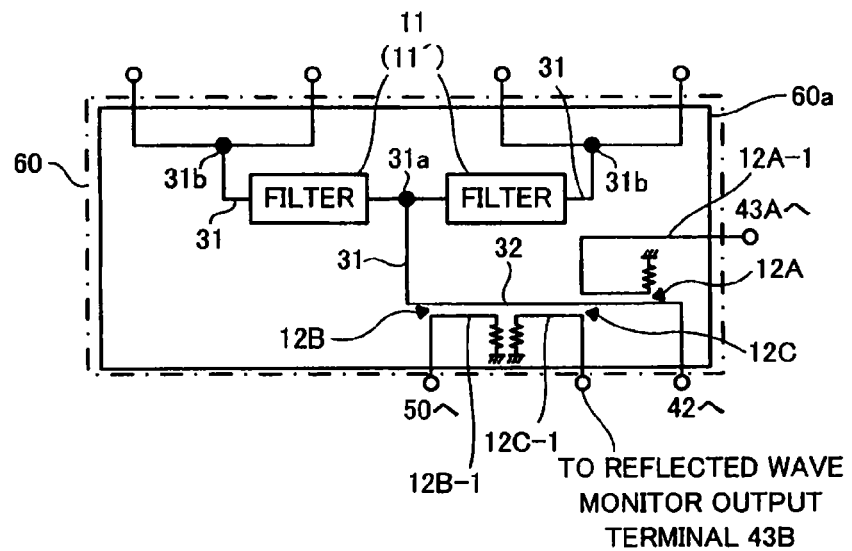
FIG. 5 is a view illustrating a configuration of a power combination unit in the power amplifying device according to a second embodiment.

FIG. 5 is a view illustrating a power combination unit 60 in a power amplifying device according to a second embodiment. This power amplifying device has the same power distributing unit 10, power amplifying element 20 and level detection detector 50 as those of the first embodiment and, in addition, has the power synthesis unit 60 which employs a configuration different from that of the power combination unit 30 of a power amplifying device 1 according to the first embodiment.

The power combination unit 60 of the power amplifying device according to this embodiment has filters 11 (11') on a connection line 31 of a previous stage of the last stage (the connection line 31 between a connection portion 31a of the last stage and a connection portion 31b of a previous stage of the last stage) in the connection line 31 on a substrate 60a. The power combination unit 60 combines and outputs high frequency signals through these filters 11 (11'). These filters 11 (11') can also be realized in the same way as the first embodiment, and therefore are small and cheap.

Further, the power amplifying device has on the substrate 60a of the power combination unit 60 first and second directional couplers 12A and 12B and, in addition, a third directional coupler 12C which monitors a reflected wave of the high frequency signal transmitted to the output line 32.

The third directional coupler 12C is a reflected wave detection directional coupler which is formed by placing part of the output line 32 and part of a third line 12C-1 which extends toward a reflection direction of the high frequency signal transmitted from one end portion connected to a reflected wave monitor output terminal 43B to the output line 32 and whose other end portion is terminated, close to each other.

The power amplifying device employing this configuration can also substantially reduce leakage of the harmonic produced by the level detection detector 50 to the RF monitor output terminal 43A by adjusting the degrees of coupling of the first and second directional couplers 12A and 12B to a degree of coupling of a directional coupler which is normally used or less (for example, about 20 dB to 60 dB) and adjusting the degree of coupling of the third directional coupler 12C to the degree of coupling of a directional coupler which is normally used or less (for example, about 20 dB to 60 dB). The degree of coupling of the third directional coupler 12C can also be adjusted in the same way as the degrees of coupling of the first and second directional couplers 12A and 12B.

Hence, the power amplifying device according to the embodiment can also accurately monitor a spurious of the harmonic produced by the power amplifying device without being influenced by a harmonic produced by the level detection detector 50.

Further, also in the power amplifying device according to the embodiment, the filters 11 (11') corresponding to filter bodies of conventional filter elements are placed on the connection line 31 without using the filter elements whose filter bodies are mounted in a package. Consequently, it is possible to miniaturize the power amplifying device.

Further, the power amplifying device according to the embodiment can also simultaneously monitor the output and the harmonic of the power amplifier without using a switch. Consequently, it is possible to miniaturize the power amplifier which can simultaneously monitor the output and the harmonic of the power amplifying device. Further, a control signal for switching the switch is unnecessary, so that it is also possible to reduce manufacturing cost of the power amplifier which can simultaneously monitor the output and the harmonic of the power amplifying device.

(Third Embodiment)

Figure 6:
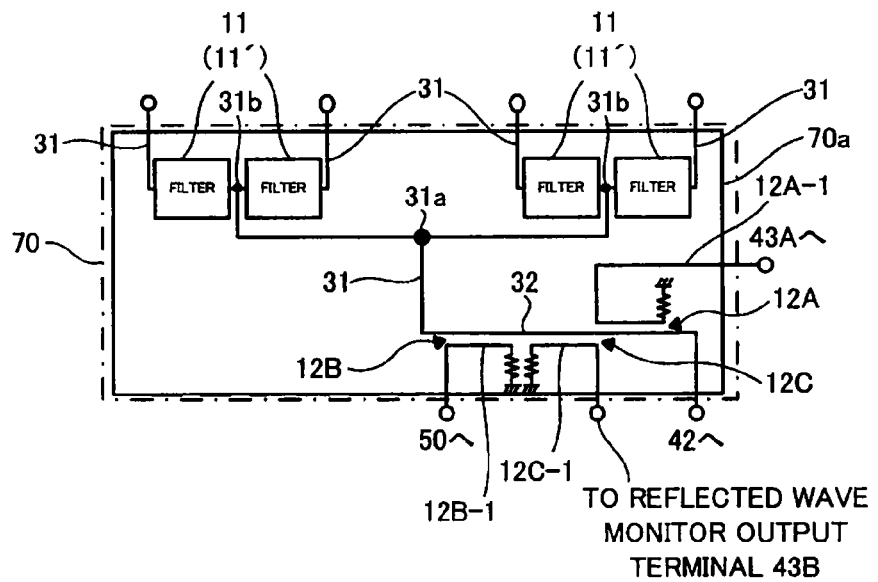
FIG. 6 is a view illustrating a configuration of a power combination unit of the power amplifying device according to a third embodiment.

FIG. 6 is a view illustrating a power combination unit 70 of a power amplifying device according to a third embodiment. This power amplifying device according to the third embodiment has the same power distributing unit 10, power amplifying element 20 and level detection detector 50 as those of the first embodiment and, in addition, has the power combination unit 70 which employs a configuration different from that of a power combination unit 30 of the power amplifying device 1 according to the first embodiment.

The power combination unit 70 of the power amplifying device according to this embodiment has filters 11 (11') on a connection line 31 of a first stage (the connection line 31 between the power amplifying element 20 and a connection portion 31b of a previous stage of the last stage (=the connection portion 31b of the first stage)) in the connection line 31 on a substrate 70a. The power combination unit 70 combines and outputs high frequency signals through these filters 11 (11'). These filters 11 (11') can also be realized in the same way as the first embodiment, and therefore are small and cheap. In addition, first to third directional couplers 12A, 12B and 12C employ the same configuration as that in the second embodiment.

Hence, the power amplifying device according to the embodiment can also accurately monitor a spurious of the harmonic produced by the power amplifying device without being influenced by a harmonic produced by the level detection detector 50.

Further, also in the power amplifying device according to the embodiment, the filters 11 (11') corresponding to filter bodies of conventional filter elements are placed on the connection line 31 without using the filter elements whose filter bodies are mounted in a package. Consequently, it is possible to miniaturize the power amplifying device.

Further, the power amplifying device according to the embodiment can also simultaneously monitor the output and the harmonic of the power amplifier without using a switch. Consequently, it is possible to miniaturize the power amplifier which can simultaneously monitor the output and the harmonic of the power amplifying device. Further, a control signal for switching the switch is unnecessary, so that it is also possible to reduce manufacturing cost of the power amplifier which can simultaneously monitor the output and the harmonic of the power amplifying device.

(Transmitter)

Figure 7:
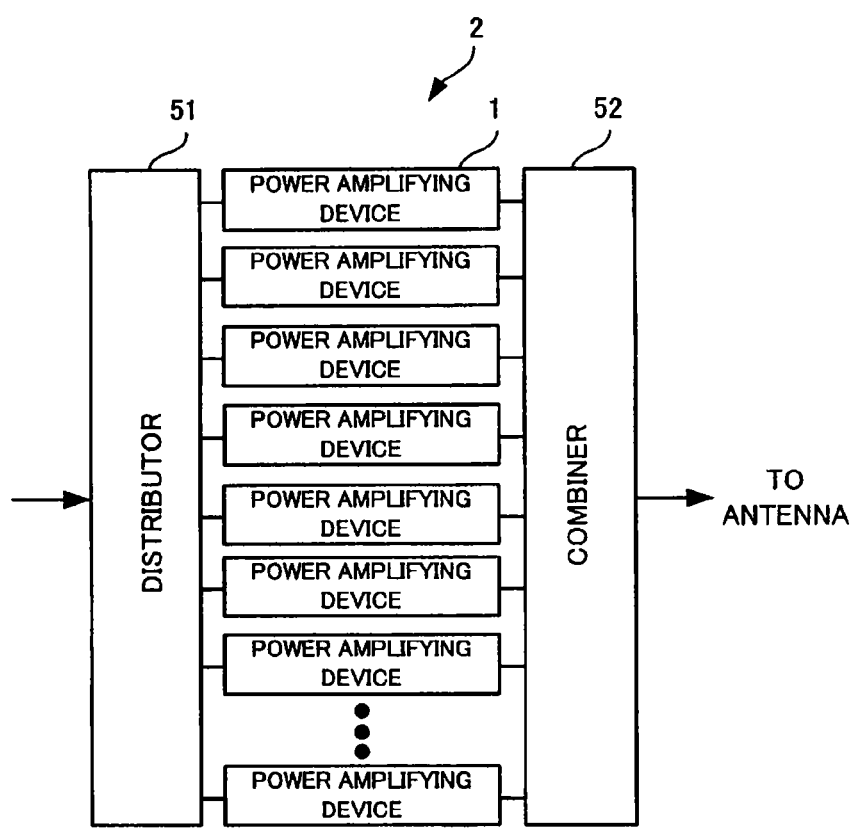
FIG. 7 is a block diagram illustrating a configuration of a transmitter.

FIG. 7 is a block diagram illustrating a configuration of a transmitter 2. As illustrated in FIG. 7, the transmitter has a distributor 51 which distributes power, a plurality of power amplifying devices 1 which is provided at a stage subsequent to the distributor 51 and which amplifies power, and a combiner 52 which is provided at a stage subsequent to the power amplifying device 1 and combines power. The transmitter 2 can adequately select and use a small power amplifying device described in the second and third embodiments in addition to the small power amplifying device 1 described in the first embodiment. Consequently, it is not necessary to provide large and expensive filters between the combiner 52 and an antenna as in a conventional technique, so that it is possible to realize the small transmitter 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplifying device comprising:
   a distribution line which distributes power;
   a plurality of power amplifying elements which is provided at a stage subsequent to the distribution line and amplifies the power distributed from the distribution line;
   a connection line which is provided at a stage subsequent to each of the power amplifying elements and combines outputs of the power amplifying elements;
   an output line which is connected to the connection line;
   a filter which is connected to the connection line or the output line, and which filters a predetermined frequency included in a high frequency signal transmitted to the connection line or the output line;
   a first directional coupler which is provided at a stage subsequent to the filter, and which outputs the high frequency signal transmitted to the output line, to a RF monitor terminal; and
   a second directional coupler which is provided at a stage subsequent to the filter, and which outputs the high frequency signal transmitted to the output line, to a level detection detector;
   wherein the filter consists of a filter body of a filter element, and wherein the filter body is provided on a substrate on which the connection line is provided.

2. The power amplifying device according to claim 1, wherein
   the filter is placed on a connection line of a last stage which combines the power in the connection line.

3. The power amplifying device according to claim 1, wherein
   the filter is placed on a connection line of a previous stage of a last stage which combines the power in the connection line.

4. The power amplifying device according to claim 1, wherein
   the filter is placed on a connection line of a first stage which is connected to each of the power amplifying elements in the connection line.

5. The power amplifying device according to claim 1, wherein
   the filter is formed by connecting a plurality of open stubs to the connection line.

6. The power amplifying device according to claim 1, wherein
   the filter is formed by connecting a plurality of disk-shaped conductors to the output line.

7. The power amplifying device according to claim 1, wherein
   the first and second directional couplers are provided on a substrate on which the connection line is provided.

8. The power amplifying device according to claim 1, wherein
   the first and second directional couplers are traveling wave detection directional couplers which detect a traveling wave of the high frequency signal transmitted to the output line.

9. The power amplifying device according to claim 1, further comprising a reflected wave detection directional coupler which detects a reflected wave of the high frequency signal transmitted to the output line.

10. A transmitter comprising:
    a distributor which distributes power;
    a plurality of power amplifying devices which amplifies the power distributed by the distributor; and
    a combiner which combines outputs of the power amplifying devices, wherein:
    each of the power amplifying devices comprises a distribution line which distributes the power distributed from the distributor;
    a plurality of power amplifying elements which is provided at a stage subsequent to the distribution line and amplifies the power distributed from the distribution line;
    a connection line which is provided at a stage subsequent to each of the power amplifying elements and combines outputs of the power amplifying elements;
    an output line which is connected to the connection line;
    a filter which is connected to the connection line or the output line, and which filters a predetermined frequency included in a high frequency signal transmitted to the connection line or the output line;
    a first directional coupler which is provided at a stage subsequent to the filter, and which outputs the high frequency signal transmitted to the output line, to a RF monitor terminal; and
    a second directional coupler which is provided at a stage subsequent to the filter, and which outputs the high frequency signal transmitted to the output line, to a level detection detector;
    wherein the filter consists of a filter body of a filter element, and wherein the filter body is provided on a substrate on which the connection line is provided.

11. The transmitter according to claim 10, wherein the filter is placed on a connection line of a last stage which combines the power in the connection line.

12. The transmitter according to claim 10, wherein the filter is placed on a connection line of a previous stage of the last stage which combines the power in the connection line.

13. The transmitter according to claim 10, wherein the filter is placed on a connection line of a first stage which is connected to each of the power amplifying elements in the connection line.

14. The transmitter according to claim 10, wherein the filter is formed by connecting a plurality of open stubs to the connection line.

15. The transmitter according to claim 10, wherein the filter is formed by connecting a plurality of disk-shaped conductors to the output line.

16. The transmitter according to claim 10, wherein the first and second directional couplers are provided on a substrate on which the connection line is provided.

17. The transmitter according to claim 10, wherein the first and second directional couplers are traveling wave detection directional couplers which detect a traveling wave of the high frequency signal transmitted to the output line.

18. The transmitter according to claim 10, further comprising a reflected wave detection directional coupler which detects a reflected wave of the high frequency signal transmitted to the output line in the power amplifying device.

19. A power amplifying device comprising:
a distribution line which distributes power;
a plurality of power amplifying elements which is provided at a stage subsequent to the distribution line and amplifies the power distributed from the distribution line;
a connection line which is provided at a stage subsequent to each of the power amplifying elements and combines outputs of the power amplifying elements;
an output line which is connected to the connection line;
a filter which is connected to the connection line or the output line, and which filters a predetermined frequency included in a high frequency signal transmitted to the connection line or the output line;
a first directional coupler which is provided at a stage subsequent to the filter, and which outputs the high frequency signal transmitted to the output line, to a RF monitor terminal; and
a second directional coupler which is provided at a stage subsequent to the filter, and which outputs the high frequency signal transmitted to the output line, to a level detection detector;
wherein the filter consists of a filter body of a filter element, and wherein the filter body is provided in a package in which the connection line is provided.

* * * * *